(12) United States Patent
Grossa et al.

(10) Patent No.: US 6,294,312 B1
(45) Date of Patent: Sep. 25, 2001

(54) TONABLE, PHOTOSENSITIVE COMPOSITION AND PROCESS FOR MAKING POLYCHROMATIC IMAGES

(75) Inventors: Mario Grossa, Dreieich; Manfred Sondergeld, Muhlheim, both of (DE)

(73) Assignee: E. I. du Pont de Nemours and Company, Wilmington, DE (US)

( * ) Notice: Subject to any disclaimer, the term of this patent is extended or adjusted under 35 U.S.C. 154(b) by 0 days.

(21) Appl. No.: 08/254,335

(22) Filed: Jun. 6, 1994

(30) Foreign Application Priority Data

Aug. 24, 1993 (DE) .................................................. 4328348

(51) Int. Cl.⁷ ...................................................... G03C 1/76
(52) U.S. Cl. ........................ 430/281.1; 430/291; 430/293
(58) Field of Search ........................ 430/281, 291, 430/293, 281.1

(56) References Cited

U.S. PATENT DOCUMENTS

| | | | |
|---|---|---|---|
| 3,582,327 | 6/1971 | Boyd et al. | 96/28 |
| 3,620,726 | 11/1971 | Chu et al. | 96/27 R |
| 3,649,268 | 3/1972 | Chu et al. | 96/27 R |
| 3,909,282 | 9/1975 | Gray | 106/288 Q |
| 4,215,193 | 7/1980 | Manger et al. | 430/291 |
| 4,243,741 | 1/1981 | Abele et al. | 430/270 |
| 4,326,010 | 4/1982 | Bauer | 428/483 |
| 4,346,162 | 8/1982 | Abele | 430/270 |
| 4,356,253 | 10/1982 | Buzzell | 430/291 |
| 4,604,340 | 8/1986 | Grossa | 430/270 |
| 4,734,356 | 3/1988 | Bauer et al. | 430/293 |
| 4,806,451 | 2/1989 | Frohlich | 430/291 |
| 4,849,322 | 7/1989 | Bauer et al. | 430/285 |
| 4,892,802 | 1/1990 | Bauer et al. | 430/270 |
| 4,948,704 | 8/1990 | Bauer et al. | 430/291 |
| 5,192,612 | 3/1993 | Otter et al. | 428/355 |
| 5,240,781 | * 8/1993 | Obata et al. | 428/488.4 |
| 5,292,622 | 3/1994 | Metzger et al. | 430/291 |
| 5,346,766 | 9/1994 | Otter et al. | 428/355 |

FOREIGN PATENT DOCUMENTS 945807    1/1964   (GB).

\* cited by examiner

*Primary Examiner*—Mark Chapman

(57) ABSTRACT

A tonable, photosensitive composition, the adhesion properties of which are controlled by a polycaprolactone having an average molecular weight of at least 50,000 and a process for preparing polychromatic images by means of such a composition are described.

6 Claims, No Drawings

TONABLE, PHOTOSENSITIVE COMPOSITION AND PROCESS FOR MAKING POLYCHROMATIC IMAGES

FIELD OF THE INVENTION

This invention relates to a tonable, photosensitive composition containing, as essential components, (a) a compound that upon actinic radiation changes in tackiness, and (b) a compound that influences the adhesion properties of the composition.

BACKGROUND OF THE INVENTION

In reprography, it is known to use halftone color separations as copy masters for making offset or letterpress plates. Before the printing plates are made, the color separations are proofed by color proofing methods to determine whether the subsequent printing results will be a tonally correct reproduction of the original.

Such color proofing methods use photosensitive recording elements that produce images from differences in the tackiness of the exposed and unexposed areas of the photosensitive layer.

For example, German Patent 12 10 321, and U.S. Pat. Nos. 3,620,726; 3,582,327; 3,649,268; 4,356,253; 4,892,802; and 4,948,704, disclose a reproduction process in which a tacky, photopolymerizable recording element, comprising a support and a photopolymerizable layer containing at least one addition- polymerizable monomer and a photopolymerization initiator, is hardened by imagewise exposure, whereby the exposed image areas lose their tackiness. The latent image is then made visible by the application of suitable toners that adhere only to the unexposed, tacky image areas and that can be removed from the non-tacky image areas. This process yields positive, optionally color images of the original, resembling in appearance the images that would be produced by using printing inks.

Negative images of the original are obtained if, for example, the photosensitive elements are used as described in U.S. Pat. Nos. 4,243,741; 4,346,162; and 4,604,340. The photosensitive components in the recording elements are either a dihydropyridine compound or a system of a dihydropyridine compound and a hexaaryl bisimidazole compound.

Toners comprising predominantly finely divided powders are applied by dusting the imagewise-exposed surface with the toner, as described, for example, in U.S. Pat. Nos. 4,215,193 and 3,909,282. Alternatively, the toner can be loosely adhered on a special support and transferred by bringing the support into contact with the imagewise-exposed layer. Such supported pigment layers are described in U.S. Pat. No 4,806,451 and DE-C 39 41 493.

Photosensitive recording elements usually comprise a support, a photosensitive layer, and a cover film. The cover film is stripped off and the element is laminated on an image receptor before imagewise exposure. Depending on the element, the support can be stripped off before or after exposure.

A repeatedly recurring problem in this process is that the cover film cannot be stripped off satisfactorily before lamination on the image receptor, because the cover film adheres too firmly to the photosensitive layer. In this case, the photosensitive layer can separate partially from the support, or parts of the layer can be torn off by the cover film. Such damaged layers can, of course, not be used for the proofing process.

The equilibrium of the photosensitive layer's adhesion between the cover film and the support can indeed be somewhat improved by adding aliphatic polyesters with molecular weights between 1,500 and 40,000, as described in U.S. Pat. No. 4,326,010. However, other difficulties exist with photosensitive recording elements thus prepared. After these photosensitive recording elements are prepared, two to ten weeks are required to reach the adhesion equilibrium. This leads to undesirable storage, delayed shipment, and additional quality control. Furthermore, the polyester concentrations needed in the coating solution for preparing the photosensitive recording elements are very highly dependent on the coating thickness of the photosensitive recording element. Consequently, it is impossible to prepare photosensitive recording elements with various coating thicknesses between 2 $\mu$m and 20 $\mu$m from one standard coating solution. Making new coating solutions for each product change increases cost.

Moreover, adding aliphatic polyesters with molecular weights between 1,500 and 40,000, as described in U.S. Pat. No. 4,326,010, limits the selection of cover films. Polypropylene films from different manufacturers or different manufacturing processes show different adhesive properties with respect to the tonable, photosensitive layer.

Another disadvantage of the photosensitive recording element described in U.S. Pat. No. 4,326,010 is the marked temperature dependence of the adhesion equilibrium. Even at a temperature of 45° C., the tonable, photosensitive recording element has lower adhesion with respect to the support, and this results in partial areas of the photosensitive layer being torn off or partial separation of the photosensitive layer from the support. Of course, such damaged layers cannot be used in color proofing processes.

Therefore, a problem addressed in this invention is the elimination of the above-cited difficulties in the color proofing process. Another problem addressed is the simplification of the process in which appropriate photosensitive recording elements are prepared.

A necessary condition is that the adhesion equilibrium of a tonable, photosensitive composition with respect to the cover film and the support, be such that (a) the cover film can be selectively stripped off first, and the support remains strippable, (b) the recording layer is not damaged in both cases, (c) the adhesion of the recording layer to an image receptor or to another recording layer is not affected, and (d) flawless toner application is ensured on the imagewise-exposed layer. These characteristics must be assured within a temperature range of 15° C.–60° C.

One aspect of the problem involved in this invention is to prepare a tonable, photosensitive composition that can yield various coating thicknesses in the range of 2 $\mu$m to 20 $\mu$m from one standard formulation.

Another aspect of the problem involved in the invention is to prepare a tonable, photosensitive composition that requires less than a week to reach adhesion equilibrium and thus can be delivered directly after preparation.

Another aspect of the problem involved in the invention is to prepare a tonable, photosensitive composition that can use polypropylene films from different manufacturing methods as the cover film.

SUMMARY OF THE INVENTION

This invention is directed to a tonable, photosensitive composition containing (a) at least one compound that reacts to actinic radiation by causing modifications in the tackiness of the composition; (b) a photoinitiator or a photoinitiator system; (c) optionally a polymeric binder or a binder mixture; and (d) at least one polycaprolactone having an average molecular weight of at least 50,000 to influence the adhesion properties of the composition.

In a preferred embodiment, the invention is directed to a positive-working, tonable, photopolymerizable composition containing (a) at least one ethylenically unsaturated, photopolymerizable compound; (b) a photoinitiator or a photoinitiator system; (c) optionally a polymeric binder or a binder system; and (d) wherein the composition contains at least one polycaprolactone with an average molecular weight of at least 50,000 to influence the adhesion properties of the composition.

In still another embodiment, the invention concerns a process for making a color image using the above-tonable, photosensitive compositions.

DETAILED DESCRIPTION OF THE INVENTION

Suitable auxiliary agents to control the adhesion properties of tonable photosensitive recording layers of the invention are polycaprolactones having an average molecular weight of at least 50,000.

Especially well suited agents are polycaprolactones having an average molecular weight between 50,000 and 250,000. More especially well suited agents are polycaprolactones having an average molecular weight between 70,000 and 180,000, and those having an average molecular weight between 100,000 and 130,000 are best suited. These polycaprolactones can be used as the only adhesion additive as well as combined with other additives such as the polyesters disclosed in U.S. Pat. No. 4,326,010. However, the addition of these polycaprolactones is especially preferred as the only additive for controlling adhesion properties.

The invention's tonable, photosensitive compositions should contain 0.05 to 5.0 percent by weight of polycaprolactones having an average molecular weight of at least 50,000. The range of 0.05 to 2.0 percent by weight is particularly preferred.

Tonable, photosensitive compositions within the scope of this invention can be positive tonable, photohardenable systems, as disclosed, for example, in DE-C 12 10 321; U.S. Pat. No. 3,620,726; or 3,649,268, as well as negative tonable systems that become tacky on irradiation, as disclosed, for example, in U.S. Pat. Nos. 4,243,741; 4,346,162; and 4,604,340. The cited negative, tonable recording elements contain either a dihydropyridine compound or a photosensitive system of a hexaaryl bisimidazole compound and a dihydropyridine.

Positive, tonable photopolymerizable recording elements are preferred for this invention. The elements described in U.S. Pat. Nos. 4,734,356; 4,849,322; 4,892,802; and 4,948,704 are particularly preferred. These elements contain a polymeric binder, at least one photopolymerizable compound, a photoinitiator, and optionally, auxiliary agents, such as plasticizers, sensitizers, fillers, antioxidants, and optical brighteners. Preferred binders are the polymers disclosed in U.S. Pat. Nos. 4,892,802 and 4,948,704 having a glass temperature less than 70° C. or less than 80° C. for polymer mixtures and with salt-forming groups crosslinked ionically through metal ions. Thermoplastic binders based on acrylate and/or methacrylate with salt-forming groups, for example, in the form of acrylic acid or methacrylic acid, have proven to be especially successful. The preferred metal ions are magnesium, calcium, strontium, barium, aluminum, tin, zinc, cadmium, titanium, zirconium, and manganese, which are added as salts, preferably as chelates.

The quantity of binder or binder mixture is generally 20–90 percent by weight, preferably 30–70 percent by weight, relative to the total weight of the dry recording layer. The content of salt-forming groups is 2–20 percent by weight, preferably 2–15 percent by weight, with at least 10 percent by weight of these groups being crosslinked through the metal ions.

Suitable photopolymerizable compounds (component (a) of applicants' invention) are known monomers and oligomers. Compounds with multiple addition-polymerizable, ethylenically unsaturated groups are preferred. Combinations of these compounds are possible too. Especially preferred are acrylic and methacrylic acid esters of polyvalent alicyclic and cyclic polyols and aromatic hydroxy compounds, such as, for example, ethylene diacrylate, diethylene glycol diacrylate, glycerol diacrylate, glycerol triacrylate, 1,3-propanediol dimethacrylate, trimethylol propane trimethacrylate, hexamethylene glycol diacrylate, and the bis- acrylates and bismethacrylates of bisphenol A, its alkoxylated derivatives and derivatives obtained by reaction with epichlorohydrin, as described, for example, in U.S. Pat. Nos. 4,734,356 and 4,849,322. The monomers are customarily used in quantities of 10 to 80 percent by weight, preferably 20 to 60 percent by weight.

Practically all compounds known as photoinitiators can be used, in quantities of 0.01 to 15 percent by weight. Examples of photoinitiators and photoinitiator systems are benzil, benzil dimethyl ketal, benzoin, benzoin isopropyl ether, α-methyl benzoin, 1,4-naphthoquinone, Michler's ketone, benzophenone, and systems of substituted thioxanthones and tertiary amines.

In addition, 5–30 percent by weight of one or more plasticizers can be used, for example, alkyl phosphates, polyethylene glycols, polyhydroxy ethylene glycol ethers, and diesters of phthalic acid, adipic acid, and caproic acid. Liquid acrylate polymers, methacrylate polymers, or butadiene/acrylonitrile copolymers with salt-forming groups are preferred.

The tonable, photosensitive compositions can be coated by known methods on suitable, preferably transparent supports and dried. Examples of suitable supports are synthetic resin films of polyethylene, polypropylene, polyamide, and polyester. Polyethylene terephthalate film is preferred.

If opaque supports are used, these should be stripped off before imagewise exposure.

The side of the recording layer positioned away from the support is provided with a flexible cover film, for example, a thin film of polystyrene, polyethylene, polypropylene, or polyethylene terephthalate. Polypropylene film is preferred.

The thickness of the recording layer can be between 2 $\mu$m and 0.1 mm depending on the desired use.

The photosensitive elements are most sensitive in the UV range, preferably in the wavelength range between 250 and 450 nm. All radiation sources that deliver an effective quantity of this radiation are suitable for exposure. Examples are xenon lamps, mercury vapor lamps, carbon arc lamps, lasers, fluorescent lamps with phosphors emitting UV radiation, and electronic flash devices.

A imagewise-exposed recording layer can be toned by dusting with toners comprising predominantly fine powders, as disclosed, for example, in U.S. Pat. Nos. 4,215,193 and 3,909,282, and by pigmented toning films containing toner loosely bonded on a special support. Such toning films are described, for example, in DE-C 39 41 493; and U.S. Pat. Nos. 4,806,451; 4,902,363; and 4,939,029.

The composition of the invention can be used advantageously, for example, for reproducing line and halftone images for use in the graphic arts and industrial fields. However, the principal field of use is the preparation of monochromatic and polychromatic images and in color proofing processes.

The color proofing process of the invention encompasses the following process steps: After removal of the cover film, a positive, tonable, photopolymerizable recording element is laminated on an image receptor. The photosensitive layer in both the polymerized and unpolymerized states adheres more firmly to the surface of the image receptor than to the recording element support.

Suitable image receptors are paper, cardboard, metals, films, or plates of polymer, such as, for example, polyethylene, polyester, polyvinyl chloride, and polyamide. The image receptor can be unmodified or can have a coating that can contain, in addition to the usual components, other compounds, such as pigments, fillers, optical brighteners, UV absorbers, and antistatic agents.

The element is then exposed to actinic radiation through the transparent support and a halftone color separation positive of a first color as the master to form nontacky areas. The support is removed by delamination. The latent image produced on the image receptor is made visible by the application of a toner that adheres only on the unexposed areas. The toner is removed from the hardened image areas resulting in a monochromatic image corresponding to the master.

A second photopolymerizable element is laminated on the image after the cover film is removed. This photopolymerizable element is exposed under the same conditions through a color separation positive of a second color as the master and is toned. This step is repeated with a color separation of a third color and, if desired, with a black separation resulting in a four-color image corresponding to the masters.

Finally, a protective layer can be applied on the monochromatic or polychromatic image. The protective layer comprises, for example, another laminate of the photohardenable, photosensitive element, from which the support is removed after overall exposure.

If a negative, tonable element that becomes tacky on irradiation is used, the color proofing process is performed in an analogous manner, except that color separation negatives are used instead of color separation positives.

These color proofing processes can be performed significantly more easily and problem-free with the tonable, photosensitive compositions of the invention or recording elements prepared from them, because stripping the cover film off the recording layer does not produce either defects in the layer or delamination from the support. In addition, there is a firm adhesive bonding of the recording layers with each other and with the image receptor, and flawless toning quality is ensured. The tonable, photosensitive compositions of the invention and/or the recording elements produced from them exhibit the desired adhesion equilibrium within four days after preparation, and therefore, can be delivered immediately after preparation. Furthermore, these tonable, photosensitive compositions permit the use of different polypropylene films as cover films. Moreover, these tonable, photosensitive compositions can be applied in various coating thicknesses from one standard coating solution.

EXAMPLES

The invention is illustrated by, but not limited to, the following examples wherein parts are by weight, unless otherwise stated. The molecular weights of the polycaprolactones were determined by gel permeation chromatography using a polystyrene standard. Weight average molecular weights are given.

Example 1

Comparison Example

A recording element was prepared as described in Example 7 of U.S. Pat. No. 4,892,802.

The 15% coating solution in methylene chloride contained:

| INGREDIENTS | AMOUNT (GRAMS) |
| --- | --- |
| Diacrylate ester of a bisphenol A epoxide resin obtained from Bisphenol A and epichlorohydrin, (viscosity 1,000,000 cps at 25° C.) | 18.48 |
| Trimethylol propane trimethacrylate | 13.66 |
| 7-(4'-chloro-6'-diethylamino-1',3',5'-triazine-4'-yl)-amino-3-phenyl-coumarin | 2.06 |
| 2-mercaptobenzoxazole | 0.83 |
| 2,2'-bis(o-chlorophenyl)-4,4',5,5'-tetraphenyl biimidazole | 1.71 |
| Trimethylol propane | 5.08 |
| Glycerol triacetate | 6.75 |
| Methoxyhydroquinone | 0.022 |
| 1,4,4-trimethyl-2,3-diazobicyclo-(3,2,2,)none-2-ene-2,3-dioxide | 0.05 |
| Diethyl hydroxylamine | 0.09 |
| Ethyl acrylate/methyl methacrylate/acrylic acid copolymer (57/39/4), MW = 192,000 | 18.06 |
| Ethyl acrylate/acrylic acid copolymer (92/8) MW = 7,000, $T_g$ = −14° C. | 5.40 |
| Ethyl acrylate/methyl methacrylate/acrylic acid copolymer (17/71/12), MW = 200,000 | 25.15 g |
| Zinc acetylacetonate (2.45 g) dissolved in 37.0 g methanol | 39.45 |
| Polycaprolactone, MW = 30,000 | 0.60 |

This solution was coated on a polyethylene terephthalate film (12.5 μm) to produce a 4 μm thick photosensitive layer after drying at 55° C. A 19 μm thick polypropylene cover film was laminated on it. The recording element was stored for 4 days, 2 weeks, and 3 weeks after preparation, placed in a commercial laminator, and tested in the warm laminator after standing for two hours. The air temperature inside the laminator reached 45° C. The test was to determine whether residues of the photosensitive compositions were found on the stripped cover film. Results are shown in Table 1 below.

Example 2

A recording element was prepared and tested as described in Example 1, except that the coating solution contained a polycaprolactone having an average molecular weight of 120,000 at a weight proportion of 0.9%, instead of polycaprolactone having an average molecular weight of 30,000. The results are provided in Table 1 below.

TABLE 1

| | AGE (days)[a] | | |
| --- | --- | --- | --- |
| | 4 | 14 | 21 |
| Recording element, Example 1 | − | − | + |
| Recording element, Example 2 | + | + | + |

[a] "−" means that residues of the photosensitive composition were found on the stripped cover film, and a "+" means that no such residues were found.

Accordingly, only the recording element from Example 2 could be used after 4 days.

Example 3

Four recording elements each were prepared from each of the coating solutions described in Examples 1 and 2. After drying, the photopolymerizable layers were 3 μm, 4 μm, 6 μm, and 12 μm. These recording elements were tested 3 weeks after preparation as described in Example 1. Results are shown in Table 2.

TABLE 2

| | Coating thickness (μm)[a] | | | |
|---|---|---|---|---|
| | 3 | 4 | 6 | 12 |
| Recording element, Example 1 | + | + | − | − |
| Recording element, Example 2 | + | + | + | + |

[a] A "−" means that residues of the photosensitive composition were found on the stripped cover film, and a "+" means that no such residues were found.

Only the photosensitive recording elements prepared from the coating solution described in Example 2 could be prepared in various coating thickness from one standard coating solution and used accordingly.

Example 4

Two recording elements as described in Example 1 (Film A) and two recording elements as described in Example 2 (Film B) were prepared with a photosensitive layer thickness of 4 μm. One of two different commercial polypropylene films was laminated on each photosensitive layer. Polypropylene film PP1 was produced by the blow-stretch method, and polypropylene film PP2 was produced by the tenter frame stretch method. The force required to strip the cover films and the polyethylene terephthalate film PET from the photosensitive layer was measured with an Instron Model 4301 Universal Tester, as described in U.S. Pat. No. 4,326,010. The cover film and the polyethylene terephthalate film respectively were stripped from the recording layer at an angle of about 180° to the edge of the support. The measurements were made on recording elements 21 days old at 22° C. and 50° C. The measurement values are given in N/mm. The stripping velocity was 100 mm/minute. Results are shown in Table 3.

TABLE 3

| Film | PET | | PP1 | | PP2 | |
|---|---|---|---|---|---|---|
| Temperature | 22° | 50° | 22° | 50° | 22° | 50° |
| Film A | 0.058 | 0.003 | 0.020 | 0.003 | 0.076 | 0.004 |
| Film B | 0.048 | 0.030 | 0.030 | 0.003 | 0.045 | 0.003 |

With Film A, the PP2 adhesion at 22° C. and 50° C. and the PP1 adhesion at 50° C. are too high relative to the adhesion of the polyethylene terephthalate film. This can result in tearing off pieces of the photosensitive layer when the cover film is stripped off. In a laminator test as described in Example 1, both polypropylene films could be stripped from Film B without residues of the tonable, photosensitive composition. However, this is the case for Film A only with polypropylene film PP1.

Example 5

To prepare a four-color proof, four recording elements were made according to Example 2 and pigmented transfer layers for cyan, magenta, yellow, and black colors were made as described in Example 12 of U.S. Pat. No. 5,090,774. After removal of its cover film, a first recording element was laminated on an image receptor and exposed through a halftone positive cyan color separation in a vacuum copy frame with a metal halide lamp (3,000 watts) using an ultraviolet-transparent filter 42 S at a spacing of 95 cm. After the support was removed, the cyan transfer layer was laminated on the imagewise-exposed layer and immediately stripped off. The transfer layer adhered only to the unexposed, tacky areas, yielding a positive cyan image of the master.

A second layer of the positive, tonable, photopolymerizable recording element was laminated on the cyan image and exposed as above through the corresponding halftone magenta color separation. After the support was removed, the magenta transfer layer was laminated on the imagewise-exposed layer and stripped off. The transfer layer adhered only to the unexposed, tacky areas, yielding a positive magenta image.

These operating steps were repeated correspondingly with the yellow and black colors and a protective layer was applied in the usual manner. A four-color proof of outstanding brilliance and sharpness was produced with a resolution of 1%–99% in the 60 lines/cm screen, representing a true-to-life reproduction of the original.

The cover films of the recording elements could be stripped off easily and without causing defects. The adhesion of the recording layers to each other and to the image receptor was outstanding.

What is claimed:

1. A tonable, photosensitive composition comprising:
   (a) at least one ethylenically unsaturated, photopolymerizable compound which, upon exposure to actinic radiation, modifies the tackiness of the composition;
   (b) a photoinitiator or a photoinitiator system;
   (c) optionally a polymeric binder or a binder mixture; and
   (d) at least one polycaprolactone with a weight average molecular weight of at least 50,000 to influence the adhesion properties of the composition.

2. The tonable, photosensitive composition of claim 1, wherein the polycaprolactone has an average molecular weight of 50,000 to 250,000.

3. The tonable, photosensitive composition of claim 2, wherein the polycaprolactone has an average molecular weight of 70,000 to 180,000.

4. The tonable, photosensitive composition of claim 3, wherein the polycaprolactone has an average molecular weight of 100,000 to 130,000.

5. The tonable, photosensitive composition of claim 1, wherein the polycaprolactone is present in the amount of up to a maximum of five percent by weight, relative to the tonable, photosensitive composition.

6. The tonable, photosensitive composition of claim 5, wherein the polycaprolactone is present in the amount of up to a maximum of two percent by weight, relative to the tonable, photosensitive composition.

* * * * *